(12) United States Patent
Haas et al.

(10) Patent No.: US 12,185,570 B2
(45) Date of Patent: Dec. 31, 2024

(54) ELECTROLUMINESCENT DISPLAY DEVICE

(71) Applicant: MICROOLED, Grenoble (FR)

(72) Inventors: Gunther Haas, St Egreve (FR); Benoit Dugreni, rue Jean Macé (FR); Michael Thomschke, St Egreve (FR)

(73) Assignee: MICROOLED, Grenoble (FR)

(*) Notice: Subject to any disclaimer, the term of this patent is extended or adjusted under 35 U.S.C. 154(b) by 658 days.

(21) Appl. No.: 17/426,069

(22) PCT Filed: Feb. 5, 2020

(86) PCT No.: PCT/FR2020/000023
§ 371 (c)(1),
(2) Date: Jul. 27, 2021

(87) PCT Pub. No.: WO2020/161400
PCT Pub. Date: Aug. 13, 2020

(65) Prior Publication Data
US 2022/0102684 A1 Mar. 31, 2022

(30) Foreign Application Priority Data

Feb. 6, 2019 (FR) ..................... 1901164

(51) Int. Cl.
*H10K 50/852* (2023.01)
*H10K 50/13* (2023.01)
(Continued)

(52) U.S. Cl.
CPC ......... *H10K 50/852* (2023.02); *H10K 50/131* (2023.02); *H10K 50/15* (2023.02); *H10K 50/16* (2023.02); *H10K 50/17* (2023.02); *H10K 50/171* (2023.02); *H10K 50/18* (2023.02); *H10K 50/828* (2023.02); *H10K 59/12* (2023.02);
(Continued)

(58) Field of Classification Search
CPC .... H10K 50/852; H10K 50/131; H10K 50/15; H10K 50/16; H10K 50/17; H10K 50/171; H10K 50/18; H10K 50/828; H10K 59/12; H10K 2101/27; H10K 2102/3026; H10K 2102/351; H10K 50/19; H10K 59/32;
(Continued)

(56) References Cited

U.S. PATENT DOCUMENTS

2016/0126500 A1* 5/2016 Uesaka ................ H10K 50/131
257/89
2018/0090719 A1* 3/2018 Han ....................... H10K 50/11

* cited by examiner

*Primary Examiner* — Patricia D Valenzuela
(74) *Attorney, Agent, or Firm* — Jordan IP Law, LLC; Todd A. Vaughn

(57) ABSTRACT

Matrix display device (100) having organic electroluminescent layers, successively comprising: a substrate, a first control electrode (101), a first light-emitting assembly comprising at least a first organic electroluminescent layer (104), a second light-emitting assembly comprising at least a second organic electroluminescent layer (106), a second electrode (102) that has opposite polarity to said first electrode and that is at least partially transparent with respect to the light emitted by said electroluminescent layers; said control electrode (101) being structured to form a display matrix; said device being characterized in that the product of the mean refraction index of the organic layers and the distance between the surface opposite the substrate of said control electrode (101) and the surface at the substrate side of said second electrode (102) is between 125 nm and 205 nm.

18 Claims, 5 Drawing Sheets

(51) Int. Cl.
*H10K 50/15* (2023.01)
*H10K 50/16* (2023.01)
*H10K 50/17* (2023.01)
*H10K 50/18* (2023.01)
*H10K 50/828* (2023.01)
*H10K 59/12* (2023.01)
*H10K 50/125* (2023.01)
*H10K 59/40* (2023.01)
*H10K 101/00* (2023.01)
*H10K 102/00* (2023.01)

(52) U.S. Cl.
CPC ........... *H10K 50/125* (2023.02); *H10K 59/40* (2023.02); *H10K 2101/27* (2023.02); *H10K 2102/3026* (2023.02); *H10K 2102/351* (2023.02)

(58) Field of Classification Search
CPC ........... H10K 59/80524; H10K 59/876; H10K 59/40; H10K 50/125
See application file for complete search history.

ELECTROLUMINESCENT DISPLAY DEVICE

CROSS-REFERENCE TO RELATED APPLICATIONS

The present application is a National Stage Application of PCT International Application No. PCT/FR2020/000023 (filed on Feb. 5, 2020), under 35 U.S.C. § 371, which claims priority to French Patent Application No. 1901164 (filed on Feb. 6, 2019), which are each hereby incorporated by reference in their complete respective entireties.

TECHNICAL FIELD

The invention relates to the field of optoelectronic devices and components, and more precisely to electroluminescent devices of the OLED (Organic Light Emitting Device) type. It relates more particularly to improving the reliability of the display color range of OLED devices of the tandem type.

BACKGROUND

OLEDs ("Organic Electroluminescent Devices") generate considerable interest for flat screen lighting systems and thin screens. OLED devices of the "top emission" type are in particular known, sometimes designated by the sign TOLED ("Top Emission OLED"), which are carried out in the form of a stack comprising a control electrode (pixelized in the case of display devices), at least one OLED emitting layer, and a (semi-)transparent electrode.

Optimizing these devices must take many electronic and optical aspects into account. From an optical standpoint, these devices form a cavity delimited by the reflective surface of the control electrode and the external surface of the semi-transparent electrode, as is described in many publications, for example "RGB tricolor produced by white-based top-emitting organic light-emitting diodes with microcavity structure" by J. Cao et al., published in 2007 in the review Current Applied Physics 7, p. 300-304, and "Top-emitting organic light-emitting diodes: influence of cavity design" by S. Hofmann et al., published in 2010 in the review Applied Physics Letters 97, p. 253308-1 to 253308-3. This microcavity effect substantially complicates the design of these devices. The publication "Combined effects of microcavity and dielectric capping layer on bidirectional organic light-emitting diodes by J. Lee et al., published in 2012 in the review Optics Letters 37(11), p. 2007-2009, analyzes this problem for an OLED device with both top emission and bottom emission.

The operating lifespan of OLED devices decreases with the increase in the current density or in the luminance because the large number of charge carriers (holes and electrons) passing through the electroluminescent organic layer causes secondary electrochemical reactions of the organic components. Yet, OLED devices with high luminance are sought, and their operating lifespan constitutes a significant stake. A particular approach to resolve this problem is the use of two or more superposed OLED diodes (devices referred to as "tandem"), that aim to reach a longer operating life under high luminance. Tandem OLED devices are in particular known, wherein the at least two OLED emitting layers each emit a light of a different color, in such a way as to obtain a white light at the output of the transparent electrode, which can then pass through optical filters placed on the front surface of the device to form color sub-pixels allowing for a color display.

More precisely, in a tandem OLED structure, several (typically two) electroluminescent units are stacked in series, connected by interconnection layers such as a transparent conductive layer (TCL) or a charge generation layer (CGL). In addition, the electron injection layers (EIL) also play an important role in reducing the electron injection barrier of the TCL or of the CGL in the first electroluminescent unite. With an identical current density, compared to a single electroluminescent device, the tandem OLED devices with two superposed electroluminescent units can have a double luminance. This satisfies the objective of providing high-luminance display screens (typically greater than 1000 cd/m2 for a color screen). Consequently, the effectiveness and the operating lifespan of tandem OLED devices can be better in relation to those of conventional OLED devices with a single unit.

The tandem geometry does not however resolve all the problems, since it represents the connection in series of two OLED systems, the individual control voltages are added together. This increases the undesirable interactions between neighboring pixels or sub-pixels, as shall be explained in what follows.

OLED display screens include in general a matrix structure of individual pixels, which is controlled by a grid of vertical and horizontal conductive tracks; this structure can allow for individual addressing of the pixels. This is schematically shown in FIG. 1 which shall be explained hereinbelow. In color screens each pixel is subdivided into sub-pixels of different colors (typically three or four, of which red, green and blue) which cooperate to emit a light point (pixel) of desired color. FIG. 3(a) shows a section of such a screen. Above the electrodes of the sub-pixels an OLED stack is deposited that covers the entire surface of the matrix and which (in this example) emits white light. The primary colors RGB (Red-Green-Blue) or RGBW (Red-Green-Blue-White, of the sub-pixels are in this case generated by colored filters located above the OLED stack. Another way of carrying out the primary colors is to structure the OLED layers in sub-pixels with different emission colors. As the method for structuring OLED layers is rather complex and the resolution that can be reached is rather limited, it is preferred even in this case to retain a maximum of common layers (i.e. layers that cover the entire surface of the matrix), in general the charge carrier transport layers, and to structure only the emitting layers. However, in the two preceding cases, it is observed that the neighboring pixels or sub-pixels can interact, by capacitive coupling or by parasitic currents passing in particular through common conductive layers of the OLED stack.

An example for this parasitic current in shown in FIG. 3(b) which shall be explained hereinbelow. This undesirable interaction between neighboring pixels or sub-pixels is known to those skilled in the art under the name "crosstalk"; it above all leads to the undesirable modification of the colors in the case of color screens. The theoretical aspects of the crosstalk phenomenon in OLED devices have been studied for a long time (see for example the publication of D. Braun "Crosstalk in passive matrix polymer LED displays" published in 1998 in the review Synthetic Metals 92, p. 107-113).

Well known in the case of OLED devices with simple diodes, the crosstalk phenomenon is exacerbated in OLED devices with tandem diodes. The interconnection layers of the superposed structures in tandem have a rather high electrical conductivity, and parasitic currents in the plane of the layers are observed. As explained hereinabove, the control voltage of tandem type OLED device is higher than for a simple OLED device, which increases the parasitic currents. This crosstalk problem becomes even more perceptible when the size of the sub-pixel decreases. Other than the numerical correction of the consequences of crosstalk (which reverts to accepting the crosstalk phenomenon and reducing the impact thereof on the image), different approaches are known to combat crosstalk at the source, i.e. to reduce the physical phenomenon at the pixel or sub-pixel.

For a simple OLED device, it is known to separate each pixel in order to insulate them from one another, with the purpose of preventing short-circuit problems linked to the humidity in the encapsulation layers. Document EP 2 927 985 describes a structure wherein each pixel is hermetically sealed and insulated from its neighboring pixels. The manufacturing of such a structure requires method steps that are numerous and complex. It is also known to delimit the pixel zones with additional separator elements, such as walls, as described in document U.S. Pat. No. 9,419,245. These methods are complex and generate significant extra cost.

In light of the above, an objective of the present invention is to remedy, at least partially, the disadvantages of the prior art mentioned hereinabove, and to propose an architecture for an OLED display device that makes it possible to significantly reduce the lateral parasitic currents, even for pixels of a very small size (typically less than 5 µm), for structures with a very small inter-pixel space, or for OLED displays of the tandem type.

Another objective of the invention is to propose a method that makes it possible to limit the parasitic currents between the pixels for a miniature electroluminescent device.

SUMMARY

According to the invention the problem is resolved by a matrix display device having organic electroluminescent layers with a tandem structure wherein the optical cavity is controlled in such a way as to preferably extract the first-order waves for a wavelength comprised between 400 nm and 700 nm, and preferably between 420 nm and 620 nm. This device is of the "top emission" type.

This device successively comprises: a substrate, a first control electrode which is structured to form a display matrix, a first light-emitting assembly comprising at least one first organic electroluminescent layer, a second light-emitting assembly comprising at least one second organic electroluminescent layer, a second electrode, that has opposite polarity to said first electrode, and is at least partially transparent with respect to the light emitted by said electroluminescent layers, said device being characterized in that the product of, on the one hand, the distance between the surface opposite the substrate of said control electrode and the surface at the substrate side of said second electrode, dCavity, and, on the other hand, the mean optical index of the organic layers that are between these two surfaces, n, is comprised between n*dCavity=125 nm and 205 nm, more preferably between 145 nm and 195 nm, and more preferably between 155 nm and 180 nm. This device represents the object of the present invention.

In an advantageous embodiment, the distance between the surface opposite the substrate of said control electrode and the surface opposite the substrate of said first electroluminescent layer is comprised between 0.3 times and 0.5 times the distance between the surface opposite the substrate of said control electrode and the surface at the substrate side of said second electrode, and preferably between 0.35 times and 0.45 times the distance between the surface opposite the substrate of said control electrode and the surface at the substrate side of said second electrode.

In another advantageous embodiment, that can be combined with the one that has just been presented, the distance between the surface opposite the substrate of said control electrode and the surface opposite the substrate of said second electroluminescent layer is comprised between 0.75 times and 0.95 times the distance between the surface opposite the substrate of said control electrode and the surface at the substrate side of said second electrode, and preferably between 0.8 times and 0.9 times the distance between the surface opposite the substrate of said control electrode and the surface at the substrate side of said second electrode.

In all the embodiments, said first and second light-emitting assemblies can be separated by at least one functional layer providing at least one of the following functions: (i) hole blocking and electron transport; (ii) electron transport; (iii) electron injection; (iv) hole injection; (v) hole transport; (vi) electron blocking and hole transport; and are preferably separated by a stack of six functional layers, each one providing one of these six functions.

Advantageously, said first organic electroluminescent layer and said first electrode are separated by at least one functional layer providing at least one of the following functions: (i) hole blocking and electron transport; (ii) hole injection; (iii) hole transport; and are preferably separated by a stack of three layers, each one providing one of these three functions.

In a particular embodiment, the device according to the invention successively comprises: (1) a substrate; (2) a first electrode layer, which is an anode; (3) a first hole injection layer; (4) a hole transport layer; (5) a first electron-blocking and hole transport layer; (6) a first electroluminescent layer; (7) a first hole-blocking and electron transport layer; (8) a first electron transport layer; (9) a second hole injection layer; (10) a second hole transport layer; (11) a second electron-blocking and hole transport layer; (12) a second electroluminescent layer; (13) a second hole-blocking and electron transport layer; (14) a second electron transport layer; (15) a first electron injection layer (which is optional and can therefore be absent); (16) a second electrode layer, which is a cathode, at least partially transparent with respect to the light emitted by said electroluminescent layers.

More precisely, in an alternative of this particular embodiment, said layers have the following thickness: (3) 0.4 nm to 1.5 nm; (4) 4 nm to 10 nm; (5) 4 nm to 10 nm; (6) 10 nm to 30 nm and preferably 15 to 25 nm; (7) 3 nm to 7 nm; (8) 3 nm to 7 nm; (9) 0.4 nm to 1.5 nm; (10) 3 nm to 7 nm; (11) 4 nm to 10 nm; (12) 10 nm to 30 nm and preferably 15 to 25 nm; (13) 4 nm to 10 nm; (14) 3 nm to 7 nm; (15) 1.2 nm to 2.5 nm; (16) 5 nm to 25 nm and preferably 8 to 20 nm.

In another alternative, said layers have the following thickness: (3) 0.7 nm to 1.3 nm; (4) 5 nm to 9 nm; (5) 5 nm to 9 nm; (6) 15 nm to 25 nm and preferably 17 nm to 23 nm; (7) 4 nm to 6 nm; (8) 4 nm to 6 nm; (9) 0.7 nm to 1.3 nm; (10) 4 nm to 6 nm; (11) 5 nm to 9 nm; (12) 15 nm to 25 nm and preferably 17 nm to 23 nm; (13) 5 nm to 9 nm; (14) 4 nm to 6 nm; (15) 1.7 nm to 2.3 nm, this layer being optional; (16) 8 nm to 20 nm and preferably 10 nm to 15 nm.

According to a first alternative applicable to all the embodiments, said first electroluminescent layer can be a fluorescent layer, preferably with blue emission, and said second electroluminescent layer is then a phosphorescent layer, preferably with yellow emission. Alternatively, said second electroluminescent layer can be a phosphorescent layer with red and green emission.

According to a second alternative applicable to all the embodiments, said second electroluminescent layer can be a fluorescent layer, preferably with blue emission, and said first electroluminescent layer is then a phosphorescent layer, preferably with yellow emission. Alternatively, said first electroluminescent layer can be a phosphorescent layer with red and green emission.

Said second electrode can be an electrode common to all the pixels.

DRAWINGS

FIG. 1 shows the electrical diagram of a matrix OLED-type screen of known type.

Figure 2A:
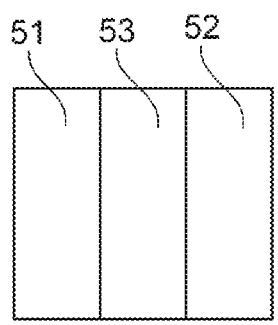
Figure 2B:
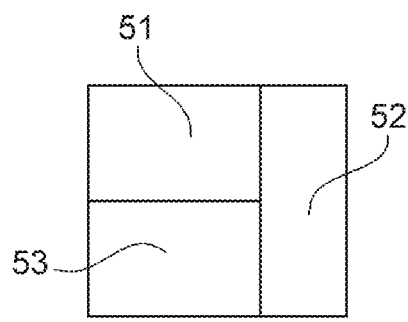
Figure 2C:
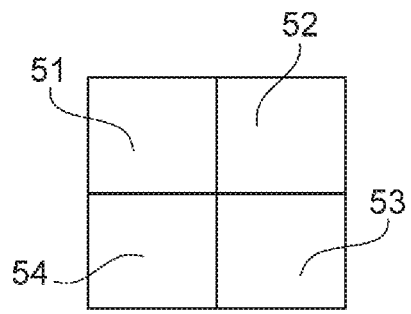

FIGS. 2a through 2c show three known examples of a disposition of sub-pixels of different colors to form a pixel capable of displaying the desired color. FIG. 2a shows a known example of a disposition of sub-pixels of different colors to form a pixel capable of displaying the desired color. FIG. 2b shows another known example of a disposition of sub-pixels of different color to form a pixel capable of displaying the desired color. FIG. 2c shows yet another known example of a disposition of sub-pixels of different colors to form a pixel capable of displaying the desired color.

Figure 3A:
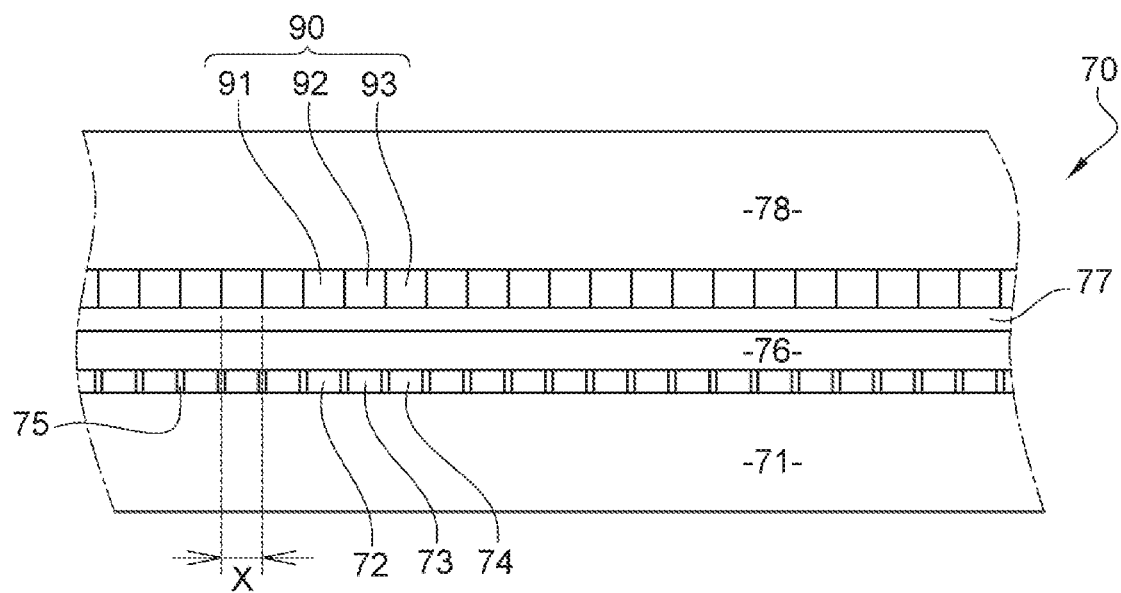
Figure 3B:
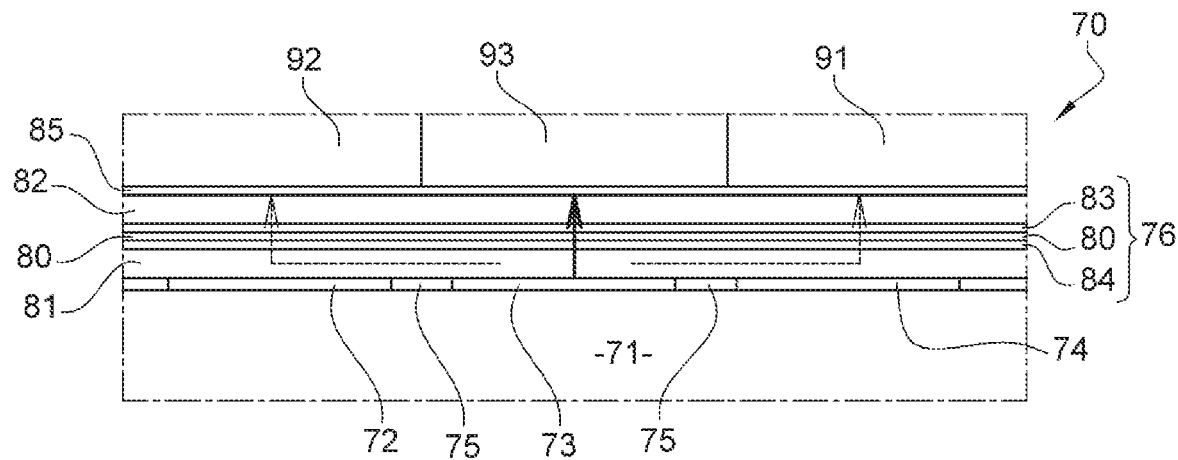
Figure 3C:
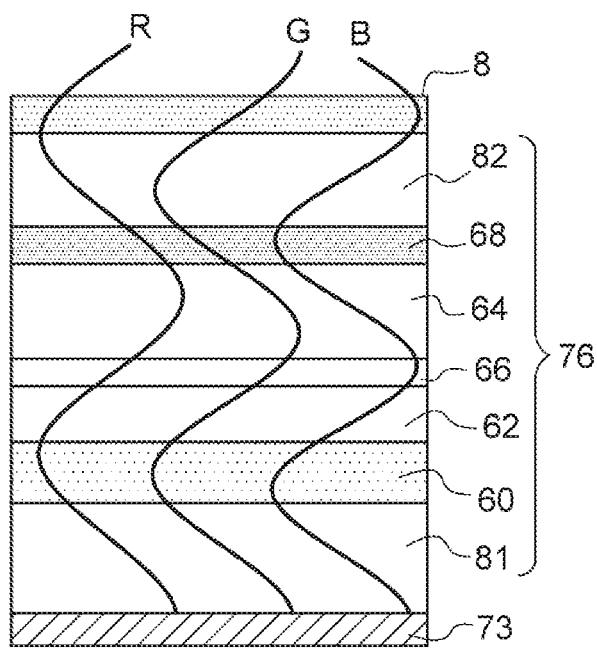

FIGS. 3a through 3c schematically show a perpendicular cross-section of a pixel in an OLED display of the "top emission" type according to the prior art, with an OLED with white emission and color filters. FIG. 3a shows several pixels of such a device. FIG. 3b shows a single pixel of this device, with three sub-pixels. FIG. 3c schematically shows the optical design of a sub-pixel of a tandem configuration according to another known embodiment.

Figure 4:
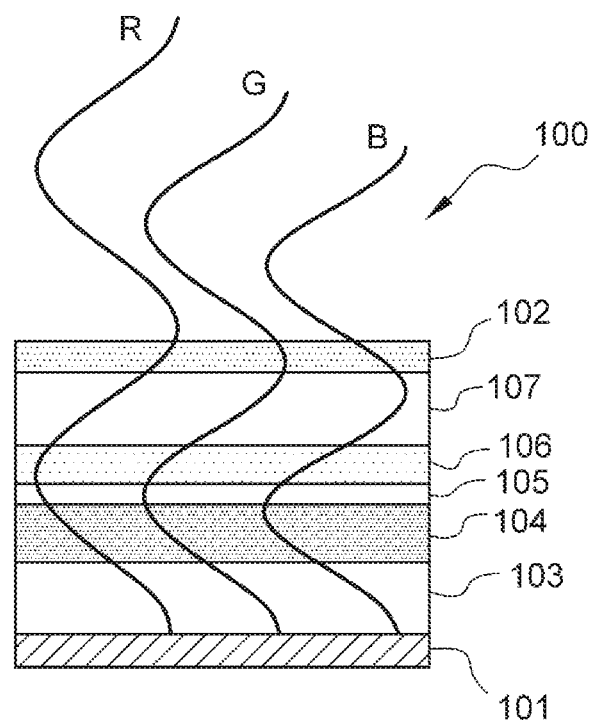
FIGS. 4, 5a, and 5b show certain aspects and embodiments of the invention; they are not meant to limit the scope of the invention.

FIG. 4 is a perpendicular cross-section view that shows a device according to one of the embodiments of the invention.

Figure 5A:
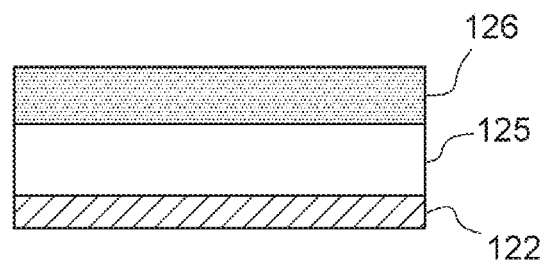
Figure 5B:
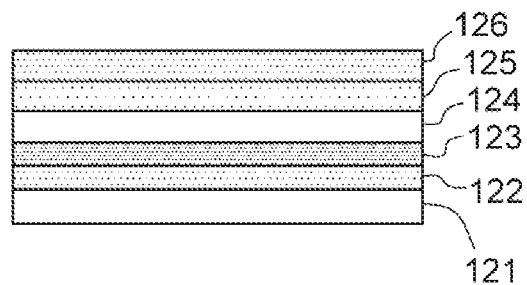

FIGS. 5a and 5b show, in the form of a perpendicular cross-section view, an embodiment of a charge generation layer that can be used in a device according to the invention. FIG. 5a shows a perpendicular cross-section view of an embodiment according to the invention. FIG. 5b shows a perpendicular cross-section view of an alternative of this embodiment.

In FIGS. 4, 5a and 5b, the color of the different layers has no meaning and is used solely to distinguish two neighboring layers.

DESCRIPTION

Unless mentioned otherwise, the concept of "conductivity" used in this description relates to electrical conductivity.

Figure 1:
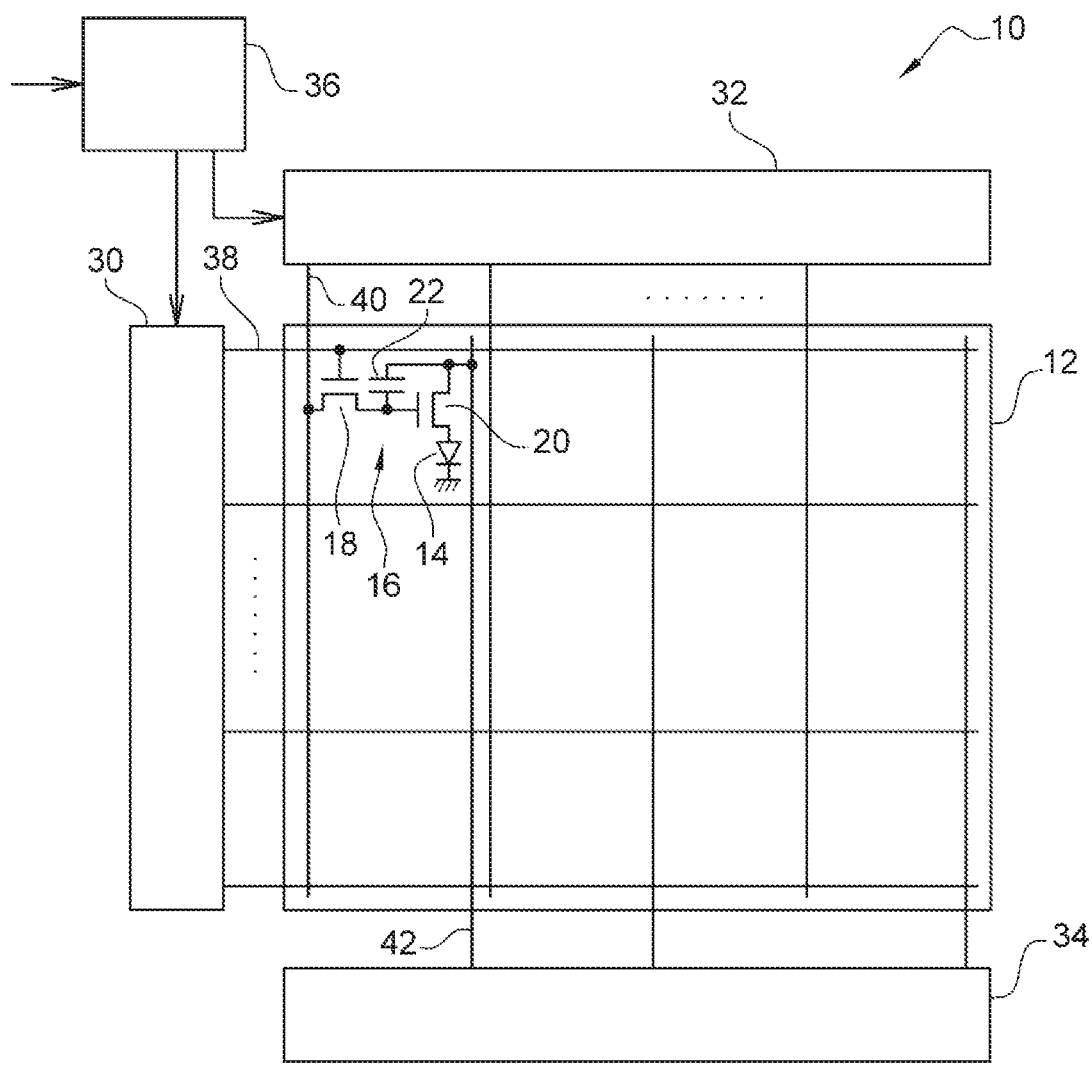
FIGS. 1 to 3 show general known aspects of OLED devices and displays.

FIG. 1 schematically shows the circuit of an OLED display 10 of a known type that comprises a pixel matrix unit 12 capable of producing an image, and a control unit 36. The OLED diodes 14 and their control circuits 16 are disposed in such a way as to form pixels in the pixel matrix unit 12, said pixel matrix including lines (horizontal) and columns (vertical). Each control circuit 16 of a pixel 12 comprises a plurality of thin layer transistors 18.20 (typically with CMOS (Complementary Metal Oxide Semiconductor) or TFT (Thin Film Transistor)) technology and a capacitor 22. The control unit 36 controls a control circuit for the lines 30 and a video addressing circuit 32, as well as an electrical power supply circuit 34 for addressing pixel columns; it provides the addressing of the pixel circuits and controls the light emission of the OLED diodes 14.

The circuit for controlling lines 30 is connected to the conductive tracks 38 that address the scanning lines of the pixel matrix. It selects the scanning lines 38 according to a signal coming from the control unit 36, and applies a voltage to turn on the field effect transistors TFT 18 that are on the selected scanning line 38. The video addressing circuit 32 is connected to conductive tracks 40 that address the columns of the video signal. The video addressing circuit 32 receives a video signal from the control unit 36 and sends a voltage over the video conductive tracks 40 of the columns according to the conductive tracks of the lines selected by the corresponding control circuit 30. This voltage signal is inscribed in the capacitor 32 through the field effect transistor TFT 18 of the OLED diode 14 of the selected pixel line. The control field effect transistor TFT 20 sends a corresponding current at the voltage recorded to the OLED diode 14, and therefore the OLED diode 14 of the selected line 38 emits light.

The electrical power circuit 34 is connected to the power supply conductive tracks 42 of the pixel columns; it powers the OLED diodes 14 through conductive tracks 32 and field effect transistors TFT 20 of the selected pixel line.

This principle of addressing an OLED diode forming a pixel in a pixel matrix, known as such, can be applied, in a manner also known as such, to the addressing of an OLED diode forming a sub-pixel in a pixel matrix of a color display device, wherein each pixel comprises a plurality of sub-pixels (most often three or four) of different colors; this shall be explained here in relation with FIG. 2. FIGS. 2(a) through 2(c) show three examples for the geometric disposition of these sub-pixels 51, 52, 53, 54 to form a pixel 50 that can display the desired color. In these figures the sub-pixels are of the color red 51, blue 52 and green 53, and can include, as in FIG. 2(c), in addition a white sub-pixel 54 to increase the luminosity of the pixel 50. The arrangement of FIG. 2(a) is known under the acronym "RGB Stripe", which is the most widespread. The arrangement of FIG. 2(c) is known under the acronym "RGBW quad".

The principle of addressing that has just been described in relation with FIGS. 1 and 2 is one of the addressing principles that can be implemented in relation to the present invention. The color can be obtained through the control of the color emitted by the OLED layers that form the sub-pixels, or by color filters that modify the white color of the light emitted by the sub-pixels, as shall be explained hereinbelow in relation to FIG. 3.

FIG. 3 schematically shows embodiments of OLED micro-displays according to the prior art; it illustrates the problem that the present invention seeks to resolve. FIG. 3(a) is a global schematic view of the structure of the device 70 according to a first known embodiment: distinguishable here are the substrate 71 (of the CMOS or TFT type, the addressing circuits and components are not shown), the control electrodes 72, 73, 74 of the sub-pixels separated by a filler element ("gap-fill") 75, the OLED layer 76 able to emit a white light, the encapsulation layer 77, the colored filters of color blue 91, red 92 and green 93 forming an assembly of colored filters for pixel 90, the glass wafer 78 as a protective cover. The size of the sub-pixels X is typically about 3.5 μm to 5 μm. Note that in this device according to the prior art, the OLED layer 76 extends over the entire surface of the device. The device is of the "top emission" type, i.e. the emission of the light generated by the OLED is done in the direction opposite the substrate 71, the circuits of the MOS or TFT type being carried out on a silicon wafer.

FIG. 3(b) shows an enlarged view of a device similar to the one shown in FIG. 3(a); this view is limited to one assembly of colored filters for a single pixel 90. The sub-pixels are defined, on the one hand, by the electrodes 72, 73, 74 which allow for the individual addressing thereof, and by the corresponding colored filters 91, 92, 93 which modify the light emitted by the OLED layer 76 with white emission that extends over the entire surface of the device. The space between two neighboring sub-pixel control electrodes 72, 73 can be filled with a filler element 75. Said OLED layer 76 is carried out as a stack of several layers and comprises the electroluminescent layer 80 per se, which is sandwiched between two charge-blocking layers 83, 84 and two charge transport layers 81, 82. More precisely, in a typical device, the layer 81 comprises a hole transport and injection layer, and the layer 82 an electron transport and injection layer. But it is also possible to use a so-called "inverse" stack, in this case the layer 82 comprises a hole transport and injection layer, and the layer 81 an electron transport and injection layer. The layers 81 and 82 can respectively comprise a single layer that fulfills both the two functions of injection and transport of the respective charges, or several layers, for example one layer for the injection and another for the transport of respective charges. A common electrode 85 evacuates the charges.

This device according to the prior art has parasitic currents in the plane of the layers; this is shown in FIG. 3(b). Indeed, if during the turning on of a sub-pixel (for example 73) the main current passes (marked by a thick arrow) directly through the OLED stack 76 in the shortest direction (i.e. vertical in relation to substrate 71), a portion of the current propagates according to other conduction paths, when these conduction paths have a resistivity that is low enough. Thus a parasitic current is observed that propagates in the charge transport layer 81, namely in the plane of the substrate, and which then passes through the OLED stack in the neighboring sub-pixel 72 or 74. This parasitic current is marked by two lateral arrows.

The OLED stack 76 comprises in its simplest characteristic an electroluminescent layer 80 as described hereinabove in FIGS. 3(a) and 3(b).

FIG. 3(c) shows the optical design of a sub-pixel of a tandem configuration according to another known embodiment. The OLED stack 76 comprises at least two emitting layers, a first yellow emitting layer 60 (which is preferably of the phosphorescent type) and a second blue emitting layer 68 (which is preferably of the fluorescent type).

More precisely, the OLED stack 76 comprises a sub-pixel control electrode 73 that plays the role of the anode, a first organic functional layer 81 of the injection or charge transport type, a first yellow emitting layer 60 of the phosphorescent type (PH-EL), a second organic functional layer 62 of the electron transport type, a charge generation layer 66 (CGL), a third organic functional layer 64 of the hole transport type, a second blue emitting layer 68 of the fluorescent type (FL-EL), a fourth organic functional layer 82 of the electron transport type, and the electrode 85 of the cathode type. The order indicated is in the direction of the optical emission of the device (i.e. from bottom to top in terms of FIG. 3(c)).

It is observed that the intermediate layers of this OLED element, which can be seen in FIGS. 3a through 3c, accentuate the parasitic currents in the plane of the layers. This generates a parasitic light emission in the neighboring sub-pixels, which modifies the image resolution of the display and decreases the fidelity of its color. The present invention seeks to provide a way to decrease this parasitic current.

FIG. 4 shows a cross-section view of an OLED system 100 of the tandem type according to an embodiment of the invention. It comprises a sub-pixel control electrode 101 (which as a general rule is the anode), a first organic functional layer 103 of the charge transport or charge injection type, a first electroluminescent layer 104 of blue fluorescent light (FL-EL), a charge generation layer 105 (CGL), a second electroluminescent layer 106 of yellow phosphorescent light, or green and red (PH-EL), a second organic functional layer 107 of the charge transport or charge injection type, and a common electrode 102 of the cathode type.

For a top emission of light, as in FIG. 4, the sub-pixel control electrode 101 is advantageously reflective; a layer of a metallic element or of a metal alloy can be suitable. On the other hand, the common electrode 102 of the cathode type is transparent or semi-transparent.

The charge generation layer 105 can be a single layer or comprised of several layers.

The functional organic layers can have different functions, simultaneously or in different alternatives. This can be charge transport layers, charge-blocking layers, prime layers, optical layers. Examples shall be given hereinbelow.

In order to have optimum light intensity the thickness of the layers has to be carefully controlled. More precisely, the thicknesses of the different layers have to be chosen in such a way that the blue and yellow emission zones (or green and red) are in a favorable position in the optical cavity so as to guarantee maximum optical effectiveness, and at the same time obtain the desired white point (i.e. the ratio between the yellow and blue component). According to the invention, a first-order emission for blue and for yellow is used for this, as is schematically shown in FIG. 4 by the waves.

Given here are a few explanations on the carrying out of such a device.

The substrate (not shown in FIG. 4, it is advantageously below the control electrode 101) can be a device of the CMOS type (typically carried out on a silicon wafer), or a device of the TFT type (typically carried out with amorphous silicon, polycrystalline silicon, and/or as TFT of the oxide or other type) that can be deposited on a glass wafer; this substrate can be transparent, semi-transparent or opaque.

The sub-pixel electrode 101 can be made of metal (in particular of aluminum), with a typical thickness comprised between 20 nm and 1,000 nm, and preferably between 100 nm and 300 nm, and optionally covered with a thin layer which protects it from oxidation in the air; this protective layer can be a layer of TiN (preferred), of MoO3, or of another similar material having a stability in air and conductivity that are sufficient.

The sub-pixel step is advantageously comprised between 1 μm and 100 μm, and preferably between 2 μm and 10 μm. The distance between two sub-pixels is typically comprised between 0.1 μm and 10 μm, and advantageously between 0.2 μm and 1.0 μm. A separator can be used between two sub-pixels; this separator can for example be made of an organic dielectric material (for example of photosensitive resin (photoresist) or of epoxy) or of an inorganic dielectric material (for example silica, SiN, alumina), and it can fill all or a portion of the space between two sub-pixels.

The device 100 according to the invention forms an optical cavity, the light waves generated by the emitting layers being sent in the two directions in relation to the plane of the device; the waves are, consequently, reflected, partially, at the interface with the common electrode 102, which is semi-transparent, and entirely at the interface of the control electrode 101. As the wavelength generated by the at least two emitting layers is not the same, and as this light is not monochromatic, the waves undergo different interferences according to their respective wavelength.

Generally, a poor extraction of the photons generated by the electroluminescence decreases the effectiveness of the electroluminescent device. If the cavity is incorrectly sized and does not allow for the effective extraction of the generated photons, in order to obtain the target luminance, more photons have to be produced in order to offset this loss in optical effectiveness; to generate more photons the current density can be increased, but this decreases the lifespan of the device. The tandem devices theoretically generate twice as much light, but, according to the prior art, are thicker than the simple devices, which accentuates the problem of extracting photons from the optical cavity.

According to the invention, the total thickness of the optical effect layers is optimized in order to obtain a system that favors the first-order response over at least one portion of the visible spectrum, and more preferably for blue light of the visible spectrum. This requires an adaptation of the architecture of the electroluminescent device of the tandem type.

As indicated hereinabove, the charge generation layer 105 can be carried out in the form of a system of several functional layers. In an advantageous embodiment schematically shown in FIG. 5(b), said charge generation layer 105 comprises: a hole-blocking layer (HBL) 121, an electron transport layer (ETL) 122, an electron injection layer (EIL) 123, a hole injection layer (HIL) 124, a hole transport layer (HTL) 125 and an electron-blocking layer (EBL) 126. The order indicated is in the direction of the optical emission of the device (i.e. from bottom to top in terms of FIG. 4). The HBL 121, EIL 123 and EBL 126 layers are optional and can be absent; an alternative where all of said optional layers are absent is shown in FIG. 5(a), others where only one or two of said optional layers are absent are possible.

In a particular embodiment, the charge generation layer 105 is comprised successively:
of an electron transport layer (ETL) 122, said ETL layer comprising a first non-doped ETL layer and a second N-doped ETL layer;
of an HIL layer 124; and
of an HTL layer 125, said HTL layer comprising a first P-doped HTL layer and a second non-doped HTL layer.

Preferably, each one of the ETL, N-doped ETL and P-doped HTL and HTL layers has a thickness comprised between 4 nm and 6 nm (it can for example be about 5 nm), and the HIL layer 124 has a thickness comprised between 0.6 nm and 1.5 nm (it can for example be about 1 nm).

The organic functional layers 103, 107 are advantageously very thin, of a thickness less than 25 nm, which contributes to reducing the crosstalk between neighboring sub-pixels. These layers can be comprised of several layers that have different functions.

In a first embodiment the first functional organic layer 103 comprises a hole transport layer (HTL). In an alternative, it is comprised (by starting on the electrode side of pixel 101) of a hole injection layer (HIL), of said hole transport layer (HTL), and of an electron-blocking layer (EBL).

In a second embodiment, which can be combined with the first that has just been presented, the second functional organic layer 107 comprises an electron transport layer (ETL). In an alternative, it is comprised (by starting with the emitting layer 106 side) of a hole-blocking layer (HBL), of said electron transport layer (ETL), and of an electron injection layer (EIL).

The surface opposite the substrate of the first emitting layer 104 advantageously has a distance A with respect to the surface opposite the substrate of the pixelized electrode 101 which is between 0.3*dcavity and 0.5*dcavity, and preferably between 0.35*dcavity and 0.45*dcavity, dcavity being the thickness of the cavity, i.e. the distance between the surface opposite the substrate of said control electrode and the surface at the substrate side of said second electrode. This distance A is measured at the surface of said layer that is opposite the substrate; it therefore comprises the thickness of said layer. This can be a fluorescent layer with blue emission (obtained for example by doping a suitably chosen organic electroluminescent layer).

The surface opposite the substrate of the second electroluminescent layer 106 advantageously has a distance B with respect to the surface opposite the substrate of the pixelized electrode 101 which is between 0.75*dcavity and 0.95*dcavity, and preferably between 0.8*dcavity and 0.9*dcavity, dcavity being the thickness of the cavity, i.e. the distance between the surface opposite the substrate of said control electrode and the surface at the substrate side of said second electrode. This distance B is measured at the surface of said layer that is opposite the substrate; it therefore comprises the thickness of said layer. This can be a phosphorescent layer with yellow emission or red and green (obtained for example by doping a suitably chosen organic electroluminescent layer).

These first 104 and second 106 electroluminescent layers are separated by a charge generation layer 105, which can be a system of several functional layers. Advantageously the product of the total thickness of the charge generation layer system 105 (this thickness being represented by dCGL) and of the mean refraction index of the layers, n*dCGL, is between 10 nm and 70 nm, and more preferably between 30 nm and 50 nm, so as to guarantee the optical and electrical optimization of the device.

This low thickness of the layers generates the following advantages: the optical coupling of the multilayer structure is optimized for a maximum luminance over a wide visible spectrum, the intensity of the electric field in the direction perpendicular to the plane of the layers is maximized (knowing that the electric field E is proportional to U/d where U is the control voltage and d is the distance between the two electrodes 101, 102), and the conductivity in the plane of the layers, which is able to generate the crosstalk, is minimized.

The common electrode 102 can be a thin layer of metal (for example silver or aluminum). Its thickness can be comprised between 10 nm and 20 nm in the case of top emission devices (such as the one shown in FIG. 4). This layer is advantageously deposited via a directional technique, for example via thermal evaporation.

Colored filters can be used to carry out the sub-pixels of a color display. These filters can be carried out for example from photosensitive resin (known in microelectronics as "photoresist") of color, or with suitably structured interferential filters.

In a top emission type device according to the invention, the total thickness of the device, measured between the reflective surface of the control electrode and the lower surface of the common semi-transparent cathode, dcavity, has to be chosen in such a way as to allow for the extraction of the first-order light waves for the light with a wavelength comprised between 400 nm and 700 nm. The product of the mean refraction index of the organic layers, n, and the total thickness of the device such as defined hereinabove, n*dcavity is comprised between 125 nm and 205 nm, preferably comprised between 145 nm and 195 nm, and more preferably between 155 nm and 180 nm; this distance corresponds approximatively to the length (in the direction of the light beam) of the optical cavity. The approximate nature of this concept of optical cavity recognizes, on the one hand, the fact that the light emitted by the OLED layers is not monochromatic but extends over a certain range of wavelengths (typically of white light), and on the other hand the semi-transparent nature of the common electrode layer, and lastly the presence of two emitting layers disposed at a different distance with respect to the ends of the optical cavity.

EXAMPLES

Tandem displays are carried out according to the invention with 1280×1024 pixels and four sub-pixels per pixel in RGBW (Red-Green-Blue-White) disposition, with a pixel size of 9.4 µm×9.4 µm and a sub-pixel size of 4.7 µm×4.7 µm. The size of the screen of the display was 12.03 mm×9.63 mm. The nature of the different layers as well as their thickness are indicated in table 1. The total thickness of the optical cavity is 92 nm, and the mean index of the organic layers 1.8.

For the purposes of comparison a tandem display was manufactured according to the prior art shown in FIG. 3, that differed from that of the one according to the invention only by the thickness of the layers.

With identical RGBW filters an effectiveness of 8 cd/A for the display according to the prior art was found, and of 12 cd/A for the display according to the invention. The color gamut was less than 10% in the display according to the prior art, and greater than 60% for the display according to the invention.

TABLE 1

Structure of the devices according to the invention

| Layer group | Individual layer | Acronym | Thickness [nm] | Dopant |
| --- | --- | --- | --- | --- |
| Common cathode | Semi-transparent cathode | Cathode | 10-15 | — |
| Second functional organic layer | Electron injection | EIL | 2 | — |
| | Electron transport | EL | 5 | N |
| | Hole blocking/ electron transport | HBL | 7 | — |
| Second electroluminescent layer | Yellow emitting (phosphorescent) | PH-EL | 20 | yellow |
| Charge generation layer (CGL) | Electron blocking/ hole transport | EBL | 7 | — |
| | Hole transport | HTL | 5 | P |
| | Hole injection | HIL | 1 | — |
| | Electron transport | ETL | 5 | N |
| | Hole blocking/ electron transport | HBL | 5 | — |
| First electroluminescent layer | Fluorescent blue emitting | FL-EL | 20 | Blue |
| First functional organic layer | Electron blocking/ Hole transport | EBL | 7 | — |
| | Hole transport | HTL | 7 | P |
| | Hole injection | HIL | 1 | — |
| Sub-pixel control electrode | Anode (pixel) | Anode | 50-500 | — |

LIST OF REFERENCE SYMBOLS

The following numerical references are used in the present description.
10 OLED display (of a known type)
12 Pixel matrix
14 OLED diode
16 Control circuit of pixel matrix
18 Field effect transistor
20 Field effect transistor
22 Capacitor
30 Control circuit for lines
32 Video addressing circuit
34 Electrical power circuit for columns
36 Control unit
38 Conductive track for lines
40 Conductive track (video signal)
42 Power conductive track for columns
50 Pixel
51 Red sub-pixel
52 Blue sub-pixel
53 Green sub-pixel
54 White sub-pixel
60 1st electroluminescent layer
62 Organic functional layer
64 Organic functional layer
66 Charge generation layer
68 2nd electroluminescent layer
70 OLED display (of a known type)
71 Substrate
72 Sub-pixel control electrode
73 Sub-pixel control electrode
74 Sub-pixel control electrode
75 Filler element (gap-fill)
76
77 Encapsulation layer
78 Glass wafer
80 Electroluminescent layer of OLED stack
81 Charge transport and injection layer
82 Charge transport and injection layer
83 Charge-blocking layer
84 Charge-blocking layer
85 Electrode
90 Assembly of colored filters for a pixel
91 Blue filter for sub-pixel
92 Red filter for sub-pixel
93 Green filter for sub-pixel
100 OLED system according to the invention
101 Control electrode (anode)
102 Common electrode (cathode)
103 1st functional organic layer
104 1st electroluminescent layer (emitting)
105 Charge generation layer
106 2nd electroluminescent layer (emitting)
107 2nd functional organic layer
121 Hole-blocking layer
122 Electron transport layer
123 Electron injection layer
124 Hole injection layer
125 Hole transport layer
126 Electron-blocking layer

What is claimed is:
1. A matrix display device having organic electroluminescent layers, successively comprising:
a substrate;
a first electrode, to serve as a control electrode having a structure forming a display matrix;

a first light-emitting assembly comprising at least one first organic electroluminescent layer;
a second light-emitting assembly comprising at least one second organic electroluminescent layer;
a second electrode, having opposite polarity to said first electrode, the second electrode being at least partially transparent with respect to light emitted by said at least one first organic electroluminescent layer and said at least one second organic electroluminescent layer,
wherein:
a product of a mean refraction index of said at least one first organic electroluminescent layer and said at least one second organic electroluminescent layer, and a distance between a surface opposite the substrate of said first electrode and a surface at the substrate side of said second electrode is between 155 nm and 180 nm,
a distance between a surface opposite the substrate of said first electrode and a surface opposite the substrate of said at least one first organic electroluminescent layer is between 0.35 times and 0.45 times a distance between a surface opposite the substrate of said first electrode and a surface at the substrate side of said second electrode,
a distance between a surface opposite the substrate of said first electrode and a surface opposite the substrate of said at least one second organic electroluminescent layer is between 0.8 times and 0.9 times the distance between a surface opposite the substrate of said first electrode and a surface at the substrate side of said second electrode,
said first light-emitting assembly and said second light-emitting assembly are separated by a first multi-stack functional layer, each layer in the first multi-stack to perform at least one of: (i) hole blocking and electron transport, (ii) electron transport, (iii) electron injection, (iv) hole injection, (v) hole transport, (vi) electron blocking and hole transport,
said first organic electroluminescent layer and said first electrode are separated by a second multi-stacked functional layer, each layer in the second multi-stack to perform at least one of: (i) electron blocking and hole transport, (ii) hole injection, (iii) hole transport,
wherein said matrix display device successively comprises:
a substrate;
a first electrode layer serving as an anode;
a first hole injection layer having a thickness between 0.4 nm and 1.5 nm;
a hole transport layer having a thickness between 4 nm and 10 nm;
a first electron-blocking and hole transport layer having a thickness between 4 nm and 10 nm;
a first electroluminescent layer having a thickness between 15 nm to 25 nm;
a first hole-blocking and electron transport layer having a thickness between 3 nm and 7 nm;
a first electron transport layer having a thickness between 3 nm and 7 nm;
a second hole injection layer having a thickness between 0.4 nm and 1.5 nm;
a second hole transport layer having a thickness between 3 nm and 7 nm;
a second electron-blocking and hole transport layer having a thickness between 4 nm and 10 nm;
a second electroluminescent layer having a thickness between 15 nm and 25 nm;
a second hole-blocking and electron transport layer having a thickness between 4 nm and 10 nm;
a second electron transport layer having a thickness between 3 nm and 7 nm;
a first electron injection layer; and
a second electrode layer serving as a cathode that is at least partially transparent with respect to light emitted by said first electroluminescent layer and said second electroluminescent layer, the second electrode layer having a thickness between 8 nm and 20 nm.

2. The matrix display device of claim 1, wherein the first electron injection layer has a thickness between 1.2 nm and 2.5 nm.

3. The matrix display device of claim 1, wherein:
the first electron injection layer has a thickness between 0.7 nm to 1.3 nm;
the hole transport layer has a thickness between 5 nm to 9 nm;
the first electron-blocking and hole transport layer has a thickness between 5 nm to 9 nm;
the first electroluminescent layer has a thickness between 15 nm to 25 nm and preferably 17 nm to 23 nm;
the first hole-blocking and electron transport layer has a thickness between 4 nm to 6 nm; and
the first electron transport layer has a thickness between 4 nm to 6 nm.

4. The matrix display device of claim 3, wherein:
the second hole injection layer has a thickness between 0.7 nm to 1.3 nm;
the second hole transport layer has a thickness between 4 nm to 6 nm;
the second electron-blocking and hole transport layer has a thickness between 5 nm to 9 nm;
the second electroluminescent layer has a thickness between 17 nm to 23 nm;
the second hole-blocking and electron transport layer has a thickness between 5 nm to 9 nm;
the second electron transport layer has a thickness between 4 nm to 6 nm;
the first electron injection layer has a thickness between 1.7 nm to 2.3 nm; and
the second electrode layer has a thickness between 10 nm to 15 nm.

5. The matrix display device of claim 1, wherein:
said first electroluminescent layer comprises a fluorescent layer with blue emission, and
said second electroluminescent layer comprises a phosphorescent layer with yellow emission.

6. The matrix display device of claim 1, wherein:
said second electroluminescent layer comprises a fluorescent layer with blue emission, and
said first electroluminescent layer comprises a phosphorescent layer with yellow emission.

7. The matrix display device of claim 1, wherein:
said first electroluminescent layer comprises a fluorescent layer with blue emission, and
said second electroluminescent layer comprises a phosphorescent layer with red emission and green emission.

8. The matrix display device of claim 1, wherein:
said second electroluminescent layer comprises a fluorescent layer with blue emission, and
said first electroluminescent layer comprises a phosphorescent layer with red emission and green emission.

9. The matrix display device of claim 1, wherein said second electrode is an electrode common to all pixels.

10. A matrix display device having organic electroluminescent layers, successively comprising:
a substrate;
a first electrode, to serve as a control electrode having a structure forming a display matrix;
a first light-emitting assembly comprising at least one first organic electroluminescent layer;
a second light-emitting assembly comprising at least one second organic electroluminescent layer;
a second electrode, having opposite polarity to said first electrode, the second electrode being at least partially transparent with respect to light emitted by said at least one first organic electroluminescent layer and said at least one second organic electroluminescent layer,
wherein:
a product of a mean refraction index of said at least one first organic electroluminescent layer and said at least one second organic electroluminescent layer, and a distance between a surface opposite the substrate of said first electrode and a surface at the substrate side of said second electrode is between 155 nm and 180 nm,
a distance between a surface opposite the substrate of said first electrode and a surface opposite the substrate of said at least one first organic electroluminescent layer is between 0.35 times and 0.45 times a distance between a surface opposite the substrate of said first electrode and a surface at the substrate side of said second electrode,
a distance between a surface opposite the substrate of said first electrode and a surface opposite the substrate of said at least one second organic electroluminescent layer is between 0.8 times and 0.9 times the distance between a surface opposite the substrate of said first electrode and a surface at the substrate side of said second electrode,
said first light-emitting assembly and said second light-emitting assembly are separated by a first multi-stack functional layer, each layer in the first multi-stack to perform at least one of: (i) hole blocking and electron transport, (ii) electron transport, (iii) electron injection, (iv) hole injection, (v) hole transport, (vi) electron blocking and hole transport,
said first organic electroluminescent layer and said first electrode are separated by a second multi-stack functional layer, each layer in the second multi-stack to perform at least one of: (i) electron blocking and hole transport, (ii) hole injection, (iii) hole transport,
wherein said matrix display device successively comprises:
a substrate;
a first electrode layer serving as an anode;
a first hole injection layer having a thickness between 0.4 nm and 1.5 nm;
a hole transport layer having a thickness between 4 nm and 10 nm;
a first electron-blocking and hole transport layer having a thickness between 4 nm and 10 nm;
a first electroluminescent layer having a thickness between 15 nm to 25 nm;
a first hole-blocking and electron transport layer having a thickness between 3 nm and 7 nm;
a first electron transport layer having a thickness between 3 nm and 7 nm;
a second hole injection layer having a thickness between 0.4 nm and 1.5 nm;
a second hole transport layer having a thickness between 3 nm and 7 nm;
a second electron-blocking and hole transport layer having a thickness between 4 nm and 10 nm;
a second electroluminescent layer having a thickness between 15 nm and 25 nm;
a second hole-blocking and electron transport layer having a thickness between 4 nm and 10 nm;
a second electron transport layer having a thickness between 3 nm and 7 nm; and
a second electrode layer serving as a cathode that is at least partially transparent with respect to light emitted by said first electroluminescent layer and said second electroluminescent layer, the second electrode layer having a thickness between 8 nm and 20 nm.

11. The matrix display device of claim 10, wherein the first electron injection layer has a thickness between 1.2 nm and 2.5 nm.

12. The matrix display device of claim 10, wherein:
the first electron injection layer has a thickness between 0.7 nm to 1.3 nm;
the hole transport layer has a thickness between 5 nm to 9 nm;
the first electron-blocking and hole transport layer has a thickness between 5 nm to 9 nm;
the first electroluminescent layer has a thickness between 15 nm to 25 nm and preferably 17 nm to 23 nm;
the first hole-blocking and electron transport layer has a thickness between 4 nm to 6 nm; and
the first electron transport layer has a thickness between 4 nm to 6 nm.

13. The matrix display device of claim 12, wherein:
the second hole injection layer has a thickness between 0.7 nm to 1.3 nm;
the second hole transport layer has a thickness between 4 nm to 6 nm;
the second electron-blocking and hole transport layer has a thickness between 5 nm to 9 nm;
the second electroluminescent layer has a thickness between 17 nm to 23 nm;
the second hole-blocking and electron transport layer has a thickness between 5 nm to 9 nm;
the second electron transport layer has a thickness between 4 nm to 6 nm;
the first electron injection layer has a thickness between 1.7 nm to 2.3 nm; and
the second electrode layer has a thickness between 10 nm to 15 nm.

14. The matrix display device of claim 10, wherein:
said first electroluminescent layer comprises a fluorescent layer with blue emission, and
said second electroluminescent layer comprises a phosphorescent layer with yellow emission.

15. The matrix display device of claim 10, wherein:
said second electroluminescent layer comprises a fluorescent layer with blue emission, and
said first electroluminescent layer comprises a phosphorescent layer with yellow emission.

16. The matrix display device of claim 10, wherein:
said first electroluminescent layer comprises a fluorescent layer with blue emission, and
said second electroluminescent layer comprises a phosphorescent layer with red emission and green emission.

17. The matrix display device of claim 10, wherein:
said second electroluminescent layer comprises a fluorescent layer with blue emission, and said first electroluminescent layer comprises a phosphorescent layer with red emission and green emission.

18. The matrix display device of claim 10, wherein said second electrode is an electrode common to all pixels.

* * * * *